United States Patent [19]

Tidwell

[11] Patent Number: 5,170,406
[45] Date of Patent: Dec. 8, 1992

[54] HIGH-POWER, END-PUMPED SOLID STATE LASER

[75] Inventor: Steve C. Tidwell, Woodinville, Wash.
[73] Assignee: Amoco Corporation, Chicago, Ill.
[21] Appl. No.: 669,113
[22] Filed: Mar. 13, 1991
[51] Int. Cl.⁵ .................... H01S 3/091; H01S 3/092
[52] U.S. Cl. ................................................... 372/71
[58] Field of Search .......................................... 372/71

[56] References Cited

U.S. PATENT DOCUMENTS

| | | | |
|---|---|---|---|
| 3,903,483 | 9/1975 | Shajenko | 372/71 |
| 4,901,330 | 2/1990 | Wolfram et al. | 372/71 |
| 5,081,637 | 1/1992 | Fan et al. | 372/71 |

Primary Examiner—John D. Lee
Assistant Examiner—Robert E. Wise
Attorney, Agent, or Firm—Stephen G. Mican; Robert J. Wagner; Frank J. Sroka

[57] ABSTRACT

An end-pumped laser oscillator having an amplifier including a solid-state gain medium. Pump beams, which are generated by two groups of laser diode bars placed between the optical elements defining the optical resonator, are directed onto opposite end surfaces of the solid-state gain medium, which intersect the optical axis of the optical resonator. The laser diode bars of each group are circumferentially distributed about the optical axis in a uniform pattern and at the same distance along the optical axis from the gain medium. One group of diode bars is located to one side of the gain medium and the other group is located to the other side of the gain medium. Pump beam energy is thereby effectively and efficiently directed onto both end surfaces of the solid-state gain medium from a plurality of laser diode bars allowing the output power produced by the gain medium to be scaled to the thermal limits of the gain medium.

33 Claims, 10 Drawing Sheets

HIGH-POWER, END-PUMPED SOLID STATE LASER

DESCRIPTION

1. Technical Field

The present invention relates to a laser having a solid-state gain medium, and more particularly, to a solid-state laser in which the gain medium is pumped by a laser diode at an angle relative to the optical axis of the laser.

2. Background of the Invention

Many novel configurations have been developed to take advantage of the small size, high reliability, and high efficiency of diode-laser pump sources. End-pumped geometries have been used in demonstrating the highest conversion efficiencies and typically produce diffraction-limited output beams. However, the output power of end-pumped lasers has been limited due to the difficulty of efficiently coupling the pump power from multiple laser diodes into the mode volume of the solid-state gain medium. Side-pumped lasers are easily scaled to higher powers as described by Burnham and Hayes in *Optics Letters* 14:27, 1989, but these lasers suffer from low conversion efficiencies and/or reduced beam quality. The high efficiency of end-pumped lasers is due to the higher absorption of pump power, excellent overlap between pump volume and laser mode, and higher pump densities.

The output power of end-pumped designs has been increased by using multiple sources coupled into the gain medium by multiplexing: (1) the number of ends, (2) pump light polarizations, (3) source coupled fibers, and (4) incidence angles. Each of these methods have disadvantages in terms of complexity, efficiency, and/or limitations to the amount of output power scaling that can be obtained. The numerous surfaces in multiple end (or facet) lasers, for example, as described by Baer in U.S. Pat. No. 4,837,771, can add complexity and loss to the resonator. The efficiency of the diode-pumped solid-state laser drops rapidly with resonator losses if the multiple end laser has low gain. Polarization coupling can only provide a factor of two increase in the pump power and so provides little increase in laser output. Fiber-coupled lasers have been described by Kubodera and Noda, *Applied Optics* 21:2466, 1982. Fiber-coupling reduces pump brightness and, typically, results in a loss of 40 percent of the pump light. Lower pump brightness leads to lower gain and, in turn, to lower laser extraction efficiency. Fan et al. described the use of incidence angle multiplexing to achieve power scaling in *Optics Letters* 14:1057, 1989. Although high efficiencies were demonstrated using this approach, space constraints limit the number of individual pump sources that can be used and the approach is incompatible with using laser diode bars as pump sources. Also, since the pump sources are arranged across the optical axis of the laser, only one end of the gain medium can be pumped without interfering with the optical cavity of the laser. Lasers pumped along the optical axis use dichroic coatings to transmit the pump light into the gain medium and reflect the laser light back into the optical cavity. These coatings have limited transmission and typically result in a 10 to 15 percent loss of the incident pump power.

To overcome the difficulties in the prior art, an end-pumped Nd:YAG laser using high-power diode laser bar pump sources has been developed, in an arrangement that allows efficient output power scaling up to material limits.

SUMMARY OF THE INVENTION

It is an object of the present invention to provide a high conversion efficiency solid-state laser amplifier without high complexity.

It is another object of the present invention to provide a compact end-pumped solid-state laser.

It is a further object of the present invention to provide a laser pump source that produces pump light incident on the solid-state gain medium at an angle, which allows the use of several diode bars in a circumferential array to increase output power.

Yet another object of the present invention is to provide that both ends of a solid-state gain medium can be pumped simultaneously.

A still further object of the present invention is to provide a laser pump source having high efficiency.

In addition, an object of the present invention is to provide high efficiency transfer of pump power from a laser pump source to a solid-state gain medium.

Further, it is an object of the present invention to provide a laser pump source which in no way interferes with or compromises the performance of the laser resonator.

A still further object of the present invention is to provide a laser pump source with very high intensity to produce high gain in a gain medium.

Yet another object of the present invention is to provide a thermal control system for controlling the temperature of a laser diode.

The present invention relates to optically coupling diode bars into solid-state end-pumped gain media, off-axis geometric multiplexing of diode lasers, and lens designs for producing high intensity spots with diode bars. Because the laser system of the present invention is intended for general use, it must provide a high-quality $TEM_{00}$ beam for mode locking, efficient doubling, and other nonlinear optic applications.

According to one aspect, the invention is a laser amplifier comprising a solid-state gain medium and at least one pump beam means. The solid-state gain medium is located along an optical path and has first and second opposite end surfaces that are intersected by the optical path. The gain medium produces the optical energy along the optical path in response to a pump beam of energy. The at least one pump beam means is offset from and circumferentially distributed about the optical path. Each pump beam means produces and directs a pump beam upon one of the first or second opposite end surfaces of the solid-state gain medium.

According to another aspect, the invention is a laser oscillator comprising an optical cavity, a solid-state gain medium, and at least one pump beam means. The optical cavity has first and second optical elements. The first optical element receives optical energy along an optical path and reflects the optical energy back along the optical path. The second optical element receives the optical energy along the optical path and reflects a portion of the optical energy back along the optical path and couples the remainder of the energy out of the optical cavity. The solid-state gain medium is located along the optical path between the first and the second optical elements. The gain medium has first and second opposite end surfaces that are intersected by the optical path. The gain medium produces the optical energy along the optical path in response to a pump beam of energy. The pump beam means is offset from and circumferentially distributed about the optical path. Each pump beam means produces and directs a pump beam upon one of the first or second opposite end surfaces of the solid-state gain medium.

In a further aspect, the invention is a laser oscillator comprising an optical cavity, a solid-state gain medium and at least two pump beam means. The optical cavity has a first optical element and a second optical element. The first optical element receives optical energy along an optical path and reflects the optical energy back along the optical path. The second optical element receives the optical energy along the optical path and reflects a portion of the optical energy back along the optical path and couples the remainder of the energy out of the optical cavity. The solid-state gain medium is located along the optical path between the first and the second optical elements. The gain medium has first and second opposite end surfaces that are intersected by the optical path. The gain medium produces the optical energy along the optical path in response to a pump beam of energy. One of the pump beam means produces a plurality of pump beams and directs its plurality of pump beams upon one opposite surface of the solid-state gain medium and the second pump beam means produces a plurality of pump beams and directs its plurality of pump beams upon the other opposite surface of the solid-state gain medium. The pump beams are directed on the opposite surfaces of the solid-state gain medium from distinct directions different from the first and second directions.

In a still further aspect, the invention is a thermal control system for controlling the temperature of a laser diode. The thermal control system comprises a thermal conductor that conducts heat from the laser diode and a thermal controller that connects to the thermal conductor and controls the conduction of the heat from the thermal conductor means to a thermal sink.

DETAILED DESCRIPTION OF THE INVENTION

Figure 1:
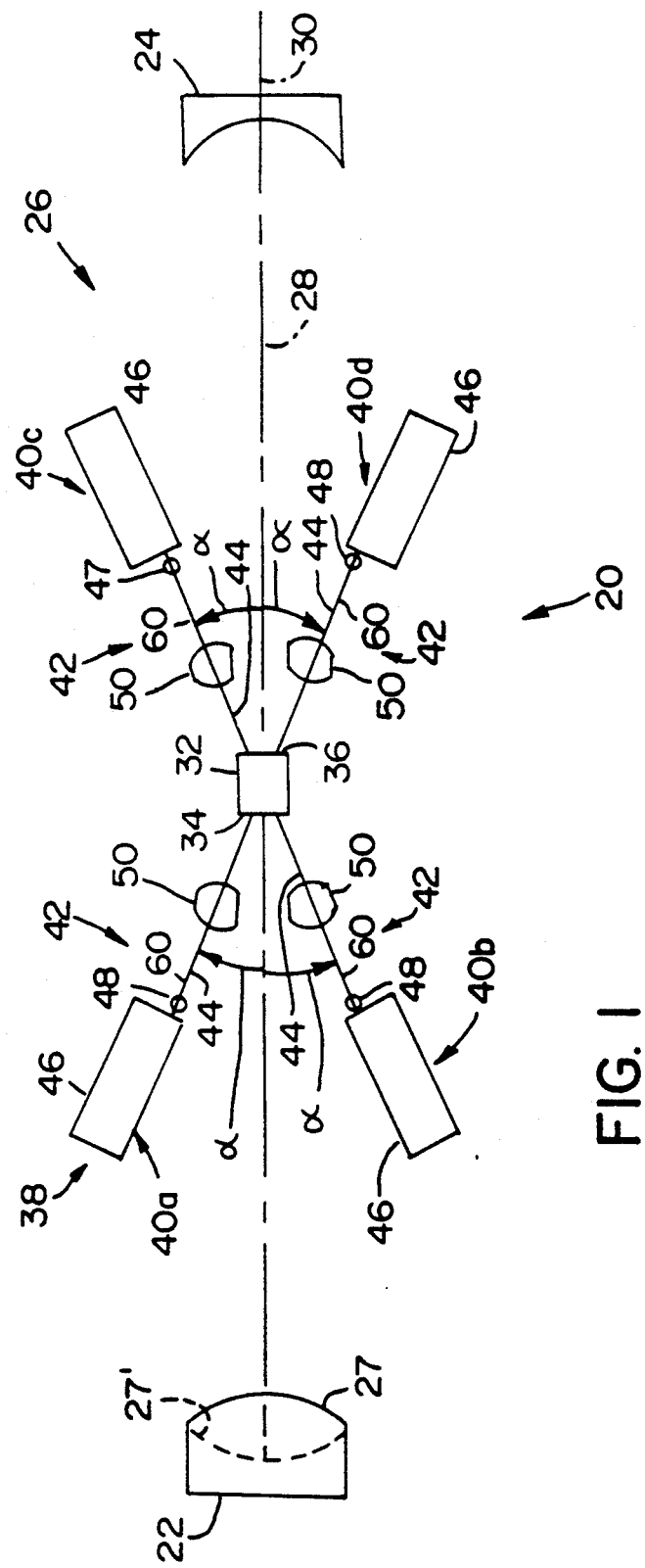
FIG. 1 is a schematic top plan view of a first embodiment of a laser oscillator according to the present invention.

FIG. 1 is a schematic top plan view of a first embodiment of a laser oscillator 20 according to the present invention. The laser oscillator 20 includes a first optical element 22 and a second optical element 24, which define a resonant optical cavity 26 therebetween. In a preferred embodiment, the first optical element 22 is a mirror having a concave surface 27 with a radius of 10.6 centimeters. In another configuration, the optical element 22 can have a concave surface 27'. The second optical element 24 is a concave mirror having a radius of 1.1 meters and having approximately 97 percent reflectance at a wavelength of 1064 nanometers. The first and second optical elements 22 and 24 reflect light therebetween along an optical axis 28. Light is coupled out of the laser oscillator 20 through the second optical element 24 along an output axis 30.

The laser oscillator 20 also includes a solid-state gain medium 32 which is placed within the optical cavity 26 along the optical axis 28. The length of the oscillator 20 must be large enough to limit the intensity of optical energy at the first optical element 22 and thus avoid optical damage. The mode size and thermal focal properties of the solid-state gain medium 32 must also be determined to design the laser oscillator 20. To produce a 3 millimeter diameter mode in the solid-state gain medium 32, the separation between the first optical element 22 and the solid-state gain medium 32 is 55 centimeters. Assuming a thermal lens focal length of 2 meters, the separation between the solid-state gain medium 32 and the second optical element 24 is 23 centimeters.

The solid-state gain medium 32 includes first and second surfaces 34 and 36, respectively, which intersect the optical axis 28. In a preferred embodiment, the solid-state gain medium 32 is a neodymium:YAG (Nd:YAG) rod having a 7.5 millimeter length along the optical axis 28 between the first and second surfaces 34 and 36. Both the first and second surfaces 34 and 36 are circular and have diameters of 6.35 millimeters. In addition, the first and second surfaces 34 and 36 have dual antireflective coatings which are effective at wavelengths of 810 nanometers and 1064 nanometers.

The laser oscillator 20 further includes a pump beam means 38, which produces a plurality of pump beams at a selected pump beam wavelength and directs at least one of the pump beams on the first surface 34 and/or on the second surface 36 of the solid-state gain medium 32. The solid-state gain medium 32 and the pump beam means 38 together compose an amplifier in the laser oscillator 20. The pump beam means 38 may be entirely located between the first and second optical elements 22 and 24, but is not necessarily so. In the first embodiment of the invention shown in FIG. 1, the pump beam means 38 includes at least one pump beam source 40, each with an associated lens (or optical element) 42 for collecting, shaping and directing the pump beam along a pump beam path 44 onto one of the first or second surfaces 34 or 36. The pump beam sources 40 are identified by reference numerals 40a, 40b, 40c and 40d, and with its associated optical element 42 are arranged so that the pump beam path 44 thereof forms a predetermined angle α with the optical axis 28. The leftmost two pump beam sources 40a and 40b and their associated optical elements 42 direct their pump beam light onto the first surface 34, and the rightmost pump beam sources 40c and 40d and their associated optical elements 42 direct their pump beam light onto the second surface 36.

Each of the pump beam sources 40 includes a diode bar 46. The diode bar 46 is a 10 Watt diode bar such as Model No. SDL-3490-S, made by Spectra Diode Laboratories. This 10 Watt bar is 10 millimeters long and consists of twenty sub-arrays on 500 micron centers. Each 1 micron × 100 micron sub-array is made up of ten gain-guided stripes.

The pump beam lens 42 includes a rod lens 48 and an imaging lens 50 located along the pump beam path 44. The rod lens 48 collects the highly divergent light emitted from the pump beam source 40 in the direction perpendicular to the array of the diode bar 46 and transmits a pump beam 60 which is approximately 1 millimeter in height and only slightly divergent. The rod lens 48 is a fused silica rod with a 2 millimeter diameter and has antireflection coatings for the pump wavelength. The rod lens 48 is separated from the pump beam source 40 by a distance of approximately 0.05 millimeter. The imaging lens 50 is used to focus the pump beam into the solid-state gain medium 32. The imaging lens 50 is a biconvex lens having a focal length of 15 millimeters and antireflective coatings effective at the wavelength of the pump light.

The pump beam path 44 intersects the optical axis 28 inside the solid-state gain medium 32, a short distance from the first and/or second surfaces 34 and 36. In a particular embodiment, the imaging lens 50 is a biconvex lens, Model No. MG01L0X019 made by Melles Griot. The imaging lens 50 is placed 11.7 millimeters from the first surface 34 or second surface 36 of the solid-state gain medium 32. The opposing side of the imaging lens 50 is 14 millimeters from the pump beam source 40. The angle between the optical axis 28 and the pump beam path 44, the multiplexing angle α, is 25 degrees. As shown, a portion of the imaging lens 50 is removed to prevent obstruction of the optical axis 28.

In operation, the laser oscillator 20 produces an output beam of light having a wavelength of 1064 nanometers along the output axis 30 in response to gain action in the solid-state gain medium 32 that is induced by the pump beam means 38. In one configuration, the pump beam means 38 consists of four pump beam sources 40 and four lenses 42, all lying in the plane of FIG. 1. In another configuration, the rightmost two pump beam sources 40 and lenses 42 are rotated out of the plane of the page about the optical axis 28 so that they lie in a plane at some angle to the plane of FIG. 1. In a further configuration, the pump beam means 38 consists of only the two pump beam sources 40a and 40b and two associated pump beam lenses 42, which produce pump beam light at a wavelength of 810 nanometers and direct the pump beam light onto the first surface 34. In a still further configuration, the pump beam means 38 consists of only a single pump beam source 40 and associated pump beam lens 42.

Figure 2:
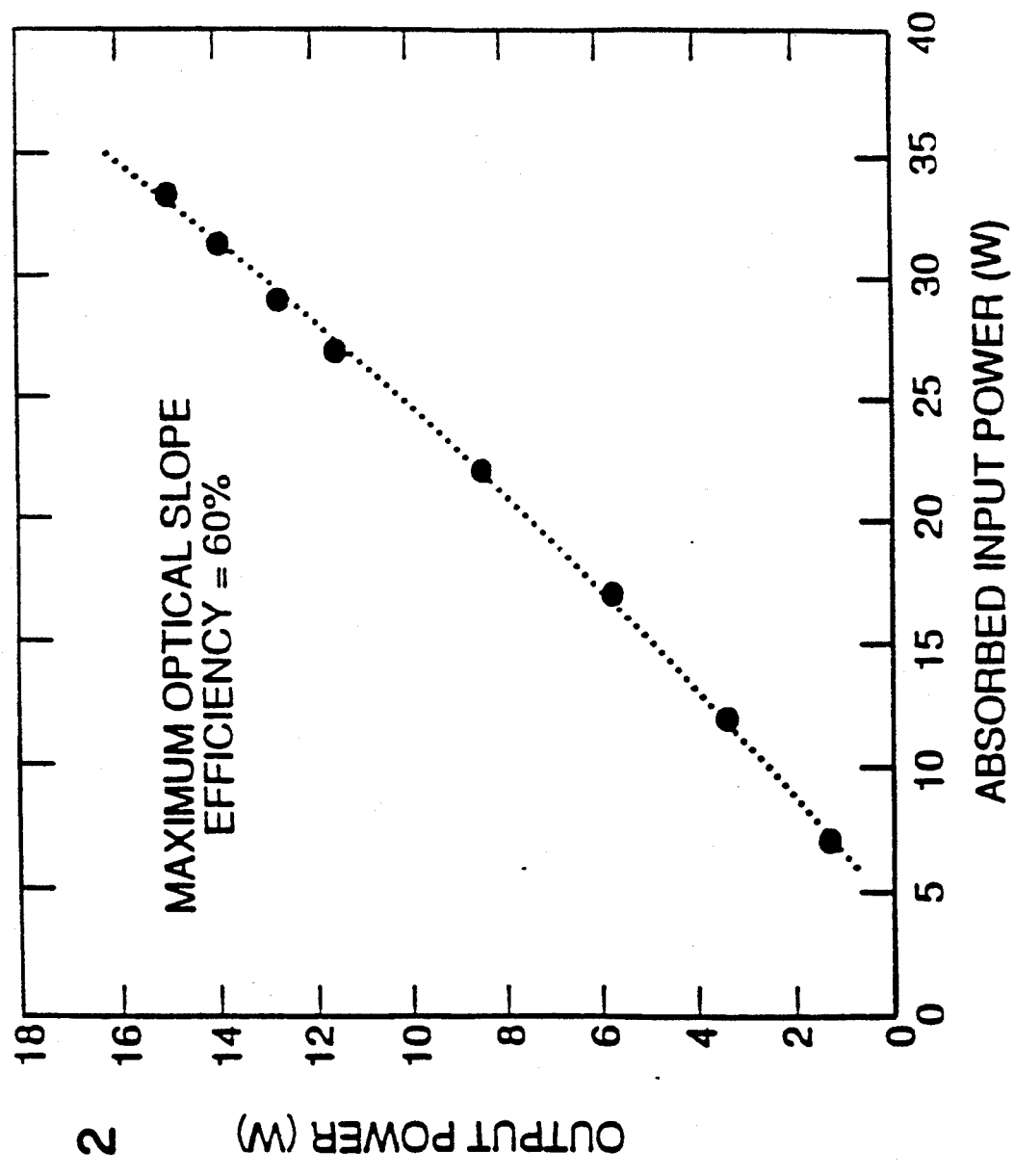
FIG. 2 is a graph plotting the output power of the first embodiment of the present invention as a function of absorbed input power.

FIG. 2 is a graph plotting the output power of the first embodiment of the present invention as a function of absorbed input power. The graph shows that above an absorbed input power of approximately 3 Watts, the present invention exhibits a maximum optical slope efficiency $\eta_s$ of approximately 60 percent, reaching power output of approximately 15 Watts for an absorbed input power of approximately 34 Watts (a total pump power of 42.6 Watts). Here, $\eta_s$ includes the quantum efficiency, 76 percent, and the extraction efficiency, $\eta_e$, which must be 79 percent (equals 60%/76%). The electrical-to-optical efficiencies of the laser diodes contained in the diode bar 46 average 30 percent, so that the overall electrical efficiencies of the Nd:YAG laser is 10.5 percent (equals 10% × 15/42.6).

Figure 3A:
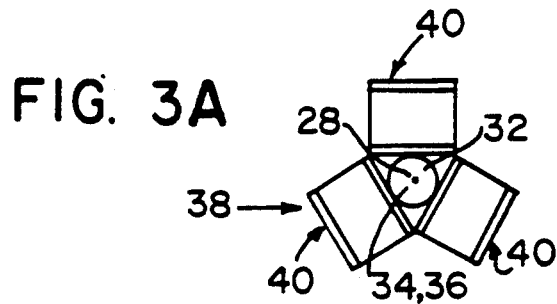
FIG. 3A is a schematic end view of a second embodiment of the present invention.
Figure 3B:
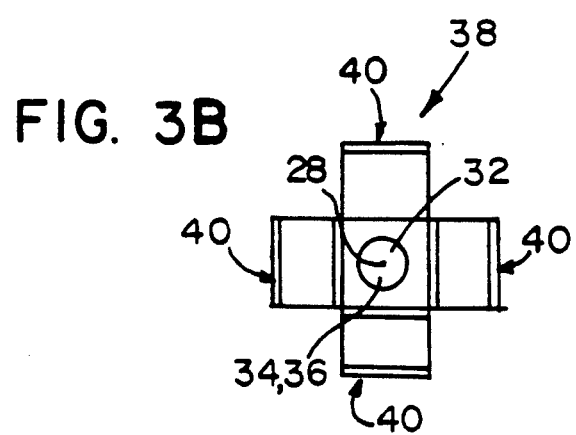
FIG. 3B is a schematic end view of a third embodiment of the present invention.
Figure 3C:
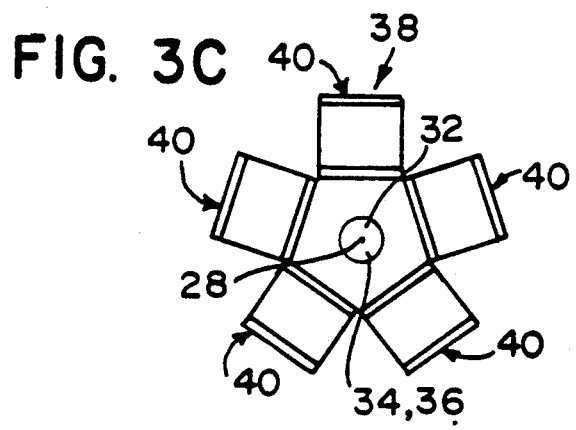
FIG. 3C is a schematic end view of a fourth embodiment of the present invention.

In other embodiments, the pump beam means 38 consists of a plurality of pump beam sources 40 and a plurality of pump beam lenses 42 arranged in a radially-symmetric (or circumferential) annular array around the optical axis 28. FIGS. 3A, 3B, and 3C are schematic end views of second, third and fourth embodiments of the present invention, respectively. They show the pump beam means 38 viewed along the optical axis 28 for radially-symmetric annular arrays using three, four and five pump beam sources 40 arranged around the first surface 34 of the solid-state gain medium 32. Each pump beam source 40 and associated lens 42 directs the pump beam along the pump beam path 44. The multiplexing angle α increases as the number of pump beam sources 40 increases to keep the separation (along the optical axis 28) between the pump beam sources 40 and the solid-state gain medium 32 fixed. A similar array of pump beam sources 40 and lenses 42 is arranged around the optical axis 28 to direct pump light onto the second surface 36.

In the second embodiment, shown in FIG. 3A, the pump beam sources 40 are circumferentially distributed about the optical axis 28 in a uniform angular pattern angularly spaced 120° away from the adjacent pump beam sources (with respect to the optical axis 28). In this embodiment, three pump beam sources 40 can each direct a pump beam onto one of the surfaces 34 or 36 with an angle α of only 5.46°, and with the minimum separation of each of the pump beam sources from the optical axis being 2.9 millimeters. The solid-state gain medium 32 is pumped with six pump beam sources 40, with three pumping light beams into the first surface 34 and the other three pumping light beams into the second surface 36.

In the third embodiment of the present invention, shown in FIG. 2B, four pump beam sources 40 are circumferentially distributed about the optical axis 28 in a uniform angular pattern, each angularly spaced 90° away from the adjacent pump beam sources, with the angle α being only 9.32°. The minimum separation of each of the pump beam sources 40 from the optical axis 28 is 5.0 millimeters. In this embodiment, the solid-state gain medium 32 is pumped with eight pump beam sources 40, with four pumping light beams into each surface.

In the fourth embodiment of the present invention, shown in FIG. 3C, five pump beam sources 40 are circumferentially distributed about the optical axis 28 in a uniform angular pattern, each angularly spaced 72° away from the adjacent pump beam sources. In this embodiment, the angle α is only 12.76° and the minimum separation between each of the pump beam sources 40 and the optical axis 28 is 6.9 millimeters. In this embodiment, each of the first and second surfaces 34 and 36 of the solid-state gain medium 32 is pumped with a 50 Watt pump beam using ten light pump sources 40, with five pumping light beams into each surface.

If desired, six pump beam sources 40 can be circumferentially distributed about the optical axis 28, each angularly spaced 60° apart, producing an angle α of only 15.9° and a separation between each of the pump beam sources 40 and the optical axis 28 of 8.66 millimeters. With the circumferentially distributed multiplexing end-pumping scheme of the present invention, additional pump power can be achieved by adding additional diode bars. Additional diode bars result in larger incident angles and, for more than four diode bars on an end, in larger pump volumes. Higher pump absorption limits the growth of the pump spot size with additional diode bars. Assuming an absorption coefficient of 5 cm$^{-1}$ gives a pump absorption of greater than 98 percent in an 8 millimeter gain medium. Since the mode size grows in proportion with pump power, for a fixed gain in efficiency, the amount of pump power that can be coupled into the solid-state gain medium 32 will not limit the scaling of end-pumped diode-pumped laser systems to higher powers. The optical efficiency of circumferentially distributed multiplexing may be as high as 44 percent, with a 35 percent efficiency having been demonstrated.

In the angular multiplexing end-pumping scheme of the present invention, additional pump power is achieved by adding diodes in annular arrays of greater radius than the first array and, accordingly, with a greater multiplexing angle α. As the multiplexing angle α increases, the pump volume also increases, since the pump light is absorbed over a significant length in the solid-state gain medium 32. Since the mode size only grows slowly as the number of pump sources increases, the amount of pump power that is delivered to the solid-state gain medium 32 using the present invention is not limited by geometrical constraints. Thus, the output power of solid state lasers is scaled up to the stress fracture limit of the solid-state gain medium 32. For example, an end-pumped Nd:YAG rod will fracture due to thermal stresses when the pump power from eight 10 Watt bars is directed onto one surface 34 or 36. Eight diode bars are arranged in an annular array with a multiplexing angle α less than 35 degrees.

In yet another configuration of the present invention, the pump beam means 38 includes a plurality of pump beam sources 40 and pump beam lenses 42 arranged in concentric annular arrays around the optical axis 28 and directed onto the first surface 34. For each annular array, the multiplexing angle α is equal for pump beam sources 40 located at a common point along the optical axis 28, but will vary between arrays located at different points along the optical axis 28. In this embodiment, the average multiplexing angle α is kept small, thereby reducing the mode size in the solid-state gain medium 32 and the overall size of the pump means 20.

In a further configuration, the solid-state gain medium 32 can have a reflective first surface 34 which performs the function of the first optical element 22, as shown in FIG. 1. In addition, if desired the first optical element 22 can be convex rather than concave, as shown in FIG. 1.

In yet another embodiment of the present invention, the pump beam means 38 and the solid-state gain medium 32 are used separately, as a laser amplifier. An extraction beam with a wavelength of 1064 nanometers incident on the first surface 34 is amplified in passing through the solid-state gain medium 32. The amplification is in response to gain action in the solid-state gain medium 32 induced by the pump beam means 38. The energy stored in the solid-state gain medium is efficiently extracted by passing the extraction beam through the solid-state gain medium 32 several times.

Figure 4B:
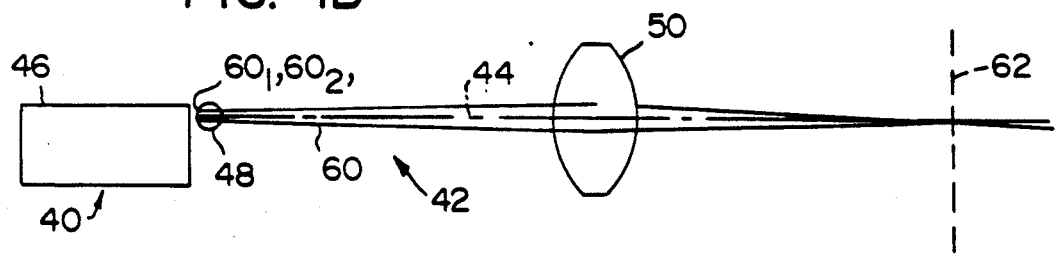
FIG. 4B is a schematic diagram of the pump source and the pump beam lens of the present invention, shown in the plane perpendicular to the laser diode array of the pump beam source.
Figure 4A:
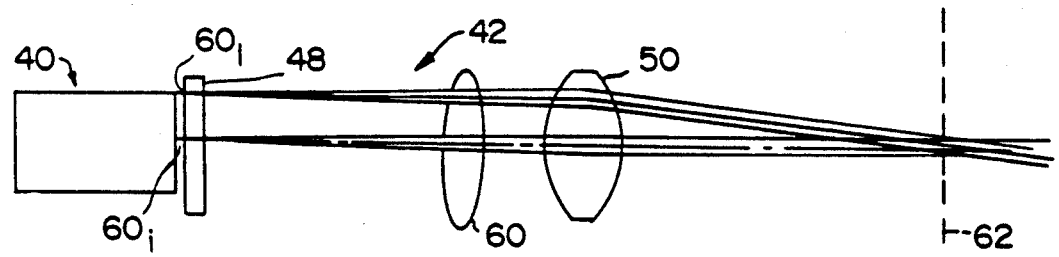
FIG. 4A is a schematic diagram of the pump source and the pump beam lens of the present invention, shown in the plane parallel to the laser diode array of the pump beam source.
Figure 5:
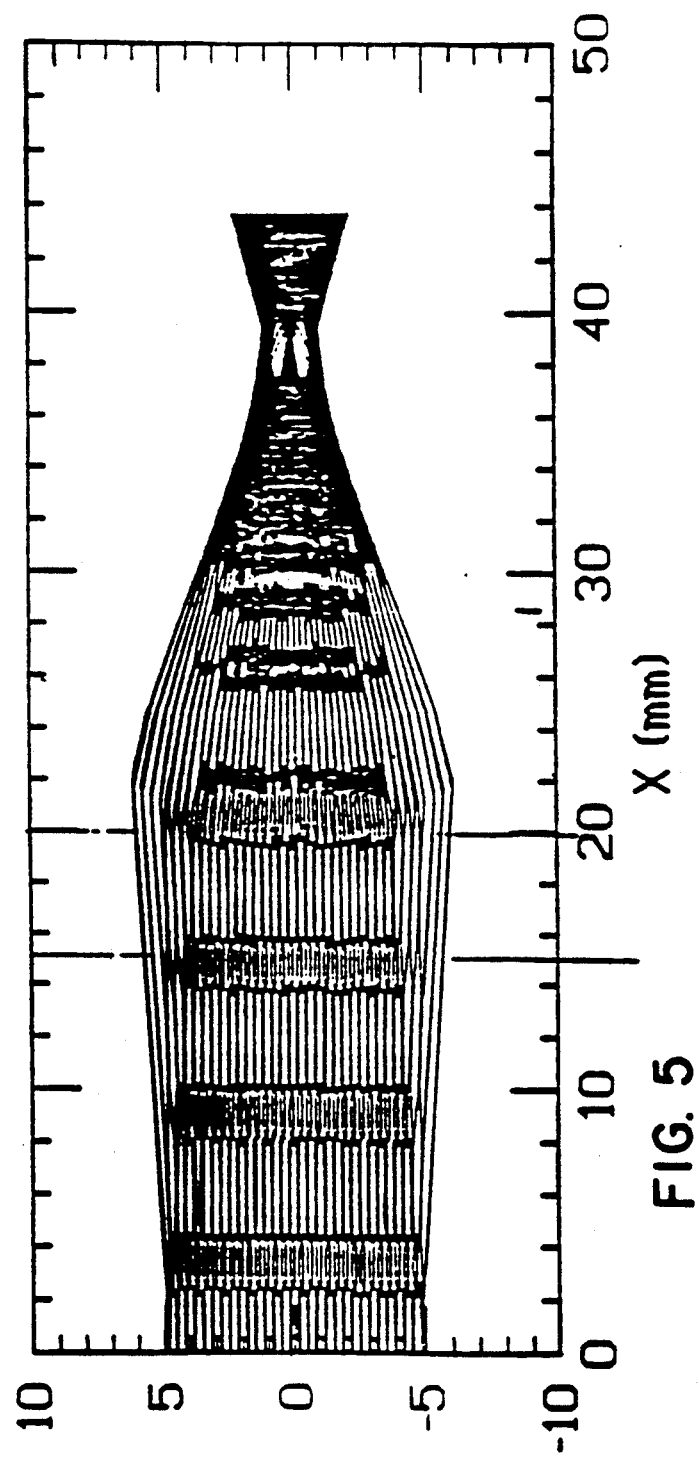
FIG. 5 is a ray trace diagram showing the propagation of pump light from a pump beam source through a pump beam lens to a focal point through conventional optics, for the present invention in the plane parallel to the laser diode array.

FIGS. 4A and 4B are schematic diagrams of the pump source and the pump beam lens of the present invention. FIG. 4A shows the plane parallel to the laser diode array. FIG. 4B shows the plane perpendicular to the laser diode array. As shown in FIG. 4A, the pump beam 60 consists of a plurality of smaller beams $60_1, \ldots 60_i$ as produced by individual sub-arrays of a diode bar. Each of the small pump beams $60_i$ is broad in the plane of FIG. 4A, but narrow in the plane of FIG. 4B. The divergence of the individual beams $60_i$ is large in the plane of FIG. 4A, 40 degrees full width half maximum (FWHM), and is small in the plane of FIG. 4B, 10 degrees FWHM. The individual beams $60_i$ are diffraction limited in the plane of FIG. 4B and so is focused to a very small spot, while the beams $60_i$ are ten to fifteen times diffraction limited in the plane of FIG. 4A. Combining the small beams produced by a laser diode bar 46 does not affect the beam quality of the pump source in the plane of FIG. 4B, while the beam quality of the pump beam source 40 increases to 1000 to 1500 times diffraction limited in the plane of FIG. 4A. The size of the pump beam 60 in the solid-state gain medium 32 is limited by the beam quality of the pump beam source 40 in the plane of FIG. 4A. Thus if the diode output is focused using f/1 optics, the minimum spot size at the surfaces of the solid-state gain medium 32 will be 1.6 millimeters. FIG. 5 is a ray trace diagram showing the propagation of the pump beam 60 from a pump beam source 40 through the associated pump beam lens 42 to a focal point, for the present invention in the plane parallel to the laser diode array.

The present invention takes advantage of the differences in beam quality of the pump beam 60 produced by the pump beam source 40 in the directions parallel and perpendicular to the array. This is done both to increase the pump power that is deposited in the mode volume of the solid-state gain medium 32 and to control the distribution of the deposited power. The multiplexing angle α in FIG. 1 is in the plane of the pump beam source 40 which is tightly focused, as shown in FIG. 4B. As the pump beam 60 crosses through the solid-state gain medium 32 and is absorbed, the pump power is deposited in a way which is made largely uniform when viewed along the optical axis 28.

Figure 6:
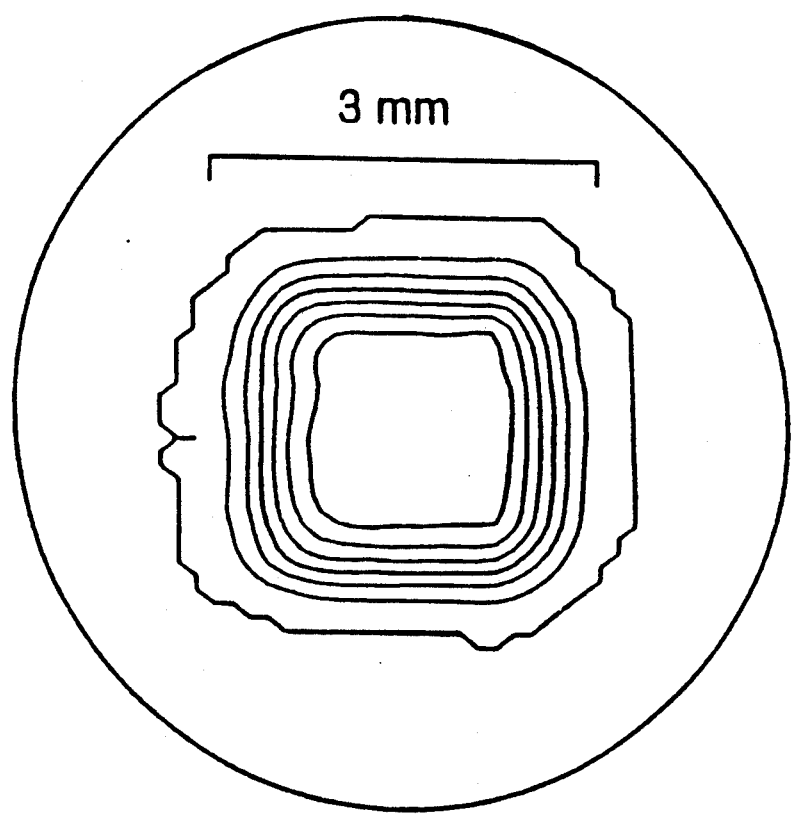
FIG. 6 is a contour plot of the 1064 nanometer fluorescence emitted from a solid-state gain medium when pumped by the pump beam means for the first embodiment of the present invention. The peak contour corresponds to a pump intensity of 600 W/cm$^2$.

FIG. 6 is a contour plot of the 1064 nanometer fluorescence emitted from the solid-state gain medium 32 when pumped by the pump beam means 38 in the first embodiment of the present invention. Approximately 80 percent of the power produced by the pump beam source 40 is absorbed in the solid-state gain medium 32 after accounting for collection, transmission, and absorption losses. If there are four pump beam sources 40, the absorbed power will be 32 Watts. The gain region is roughly square with a width of 2.2 millimeters FWHM. The effective pump intensity over the uniform central area in FIG. 6 is 600 W/cm$^2$.

To efficiently convert the pump power into high quality 1064 nanometer laser light, it is desirable to direct the highest possible pump source intensity onto the first and second surfaces 34 and 36 of the solid-state gain medium 32. Reducing the pump spot size is the most effective way to increase the pump source intensity. A second advantage of smaller mode volumes is that the laser resonant cavity 26 is shorter and less sensitive to both thermal focus variations in the solid-state gain medium 32 and alignment perturbations between the optical elements 22 and 24.

Figure 7:
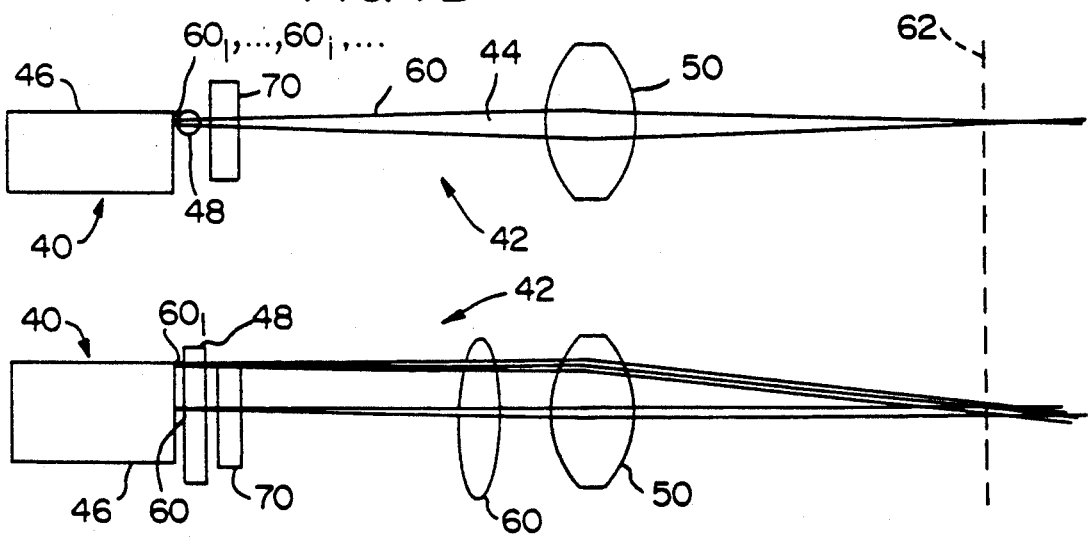
FIG. 7A is a schematic diagram of the pump beam source and an alternate pump beam lens for the present invention, shown in the plane parallel to the laser diode array of the pump beam source.
FIG. 7B is a schematic diagram of the pump beam source and an alternate pump beam lens for the present invention, shown in the plane perpendicular to the laser diode array of the pump beam source.

FIG. 7A is a schematic diagram of the pump beam source and an alternate pump beam lens for the present invention, shown in the plane parallel to the laser diode array of the pump beam source. FIG. 7B is a schematic diagram of the pump beam source and an alternate pump beam lens for the present invention, shown in the plane perpendicular to the laser diode array of the pump beam source. The alternative pump beam lens 42 includes a rod lens 48, a lens array 70, and an imaging lens 50.

The lens array 70 is an array of cylindrical or toroidal lenses. A cylindrical lens array can be assembled from optical fibers and an index-matching fluid contained within a small cell. Both the cylindrical and toroidal lens arrays can also be fabricated using high-volume techniques, such as microlithography, ion depletion, micro-machining with injection molding, and photothermal techniques. The individual elements in the lens array 70 each collimate a beam 60$_i$ emitted from a subarray of the pump beam source 40 in the plane parallel to the diode array of the diode bar 46. In doing so, the lens array 70 increases the effective beam quality of the pump beam source 40 by increasing the fill factor of the diode array of the diode bar 46. In the alternative pump beam lens 42 the rod lens 48 and the imaging lens 50 are identical to those described in the first embodiment of the present invention.

Figure 8:
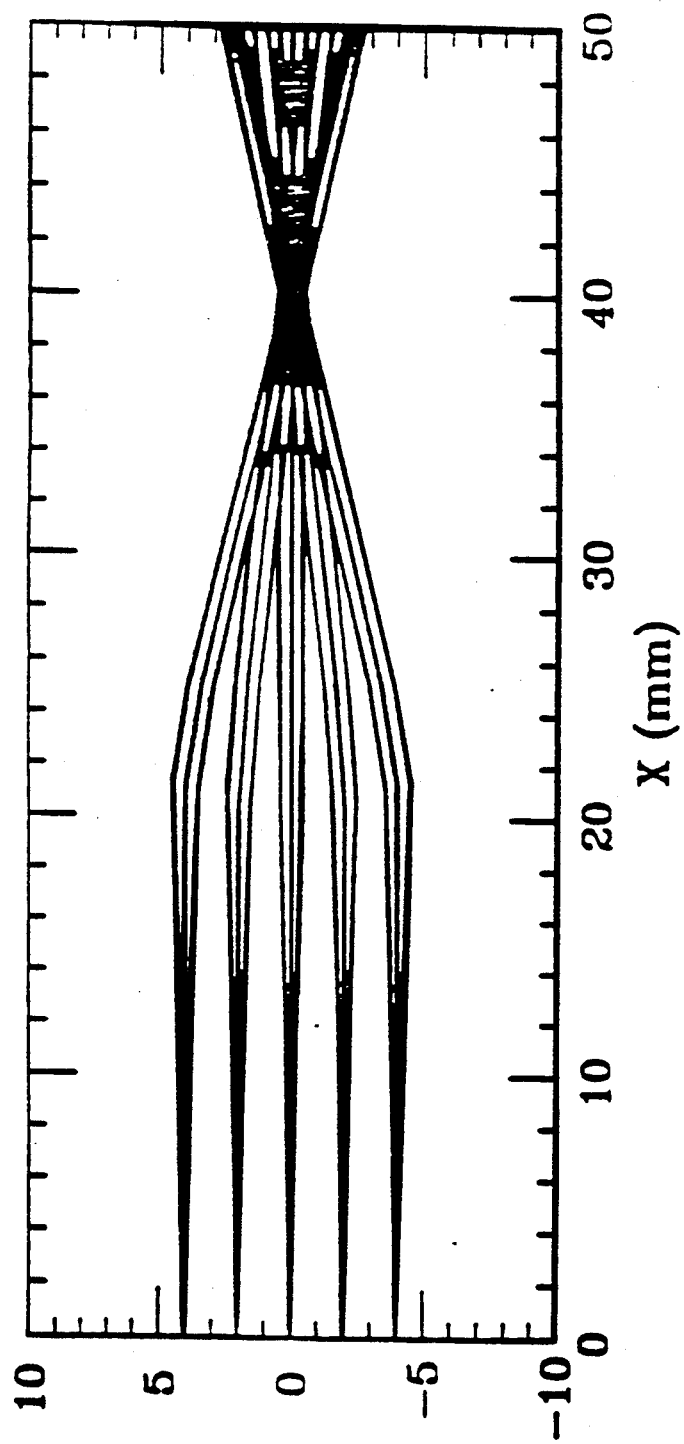
FIG. 8 is a ray trace diagram showing the propagation of pump light from a pump beam source through an alternate pump beam lens to a focal point through micro-lens array optics, for the present invention in the plane parallel to the laser diode array of the pump beam source.

FIG. 8 is a ray trace diagram showing the propagation of pump light from a pump beam source through an alternate pump beam lens to a focal point, for the present invention in the plane parallel to the laser diode array of the pump beam source. The power produced by the pump beam source 40 is focused into a spot which is considerably smaller than that produced by the lens in the first embodiment. Since the plane parallel to the diode bar array limits the pump spot size in the solid-state gain medium 32, the effective pump intensity increases significantly with the use of a lens array 70.

Figure 9:
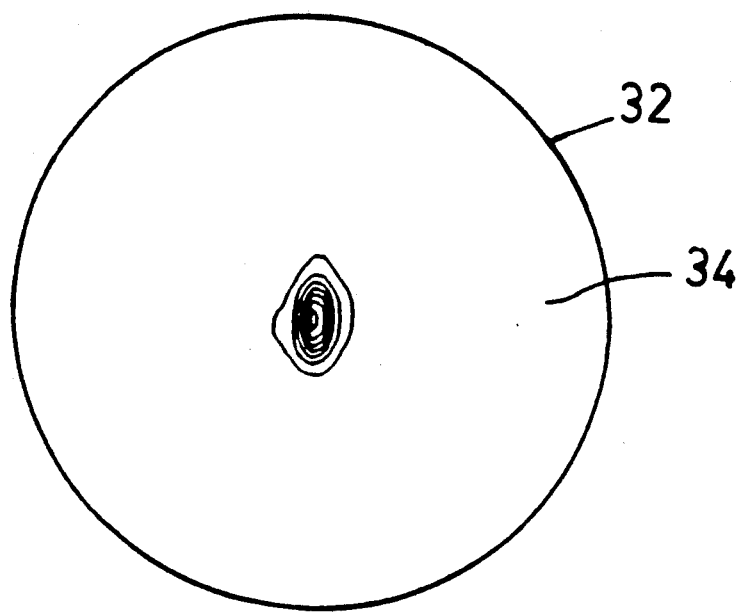
FIG. 9 is a contour plot of the 1064 nanometer fluorescence emitted from a solid-state gain medium when pumped by an alternate pump beam means of the present invention. The peak contour corresponds to a pump intensity of 2100 W/cm$^2$.

FIG. 9 is a contour plot of the 1064 nanometer fluorescence emitted from a solid-state gain medium 32 when pumped by an alternate pump beam means 38 of the present invention. The solid-state gain medium 32 in FIG. 9 has a diameter of 6.35 millimeters and a length of 7.5 millimeters. The pump beam means 38 includes a single 10 Watt pump beam source 40 directed by the alternate pump beam lens 42 to the first surface 34 of the solid-state gain medium 32 at a multiplexing angle $\alpha$ equal to 5 degrees (see FIG. 1). As above, over 80 percent of the pump light is transmitted through the pump lens 42 and absorbed within the solid-state gain medium 32. The size of the gain region in the solid-state gain medium 32 is approximately 0.4 millimeter $\times$ 0.8 millimeter FWHM and the effective pump source peak intensity is greater than 2 kW/cm$^2$.

Thermal management of the diode bars 46 is important for achieving reliable operation of the diodes and the maximum efficiency from the diode pumped laser. The 10 W laser diode bars produce approximately 25 W of heat which must be removed. Overheating can reduce the lifetime of the diodes in the diode bars and cause catastrophic failure. Also, the temperature of the diodes must be tightly controlled since the wavelength produced by a laser diode varies with the diode's temperature. A temperature change can cause the output of a diode laser to drift off the Nd:YAG absorption band, resulting in increased transmission of the pump light through the lasing medium 32 and, therefore, signficant power loss.

While it is possible to remove the heat and control the temperature of a diode bar with a thermal electric cooler (TEC) sandwiched between a heat spreader (not shown) and a water cooled heat exchanger (not shown), it has been found that such TECs have several drawbacks. first, the TECs are approximately 25% efficiency and so require approximately 100 W of power to remove 25 W of heat. The efficiency of a laser system using TECs will therefore be dominated by the efficiency of the cooling system. Second, the TECs needed to remove 25 W are large and conflict with the compact nature of laser diodes. Third, TECs are poor thermal conductors when not operating and since large TECs do not hold up to thermal cycling, they present a high-risk, single-point failure mechanism for a diode-laser-pumped solid-state laser system.

In another approach to thermal management, water cooling can be used directly, thus maintaining the compact, efficient, and reliable nature of laser diode pumped lasers. This is accomplished in the first embodiment of the invention, shown in FIG. 1, by circulating a refrigerated coolant bath at a temperature near 0° C. to all of the diode bars 46 and biasing the operating temperature of each diode with a variable thermal resistance.

Figure 10:
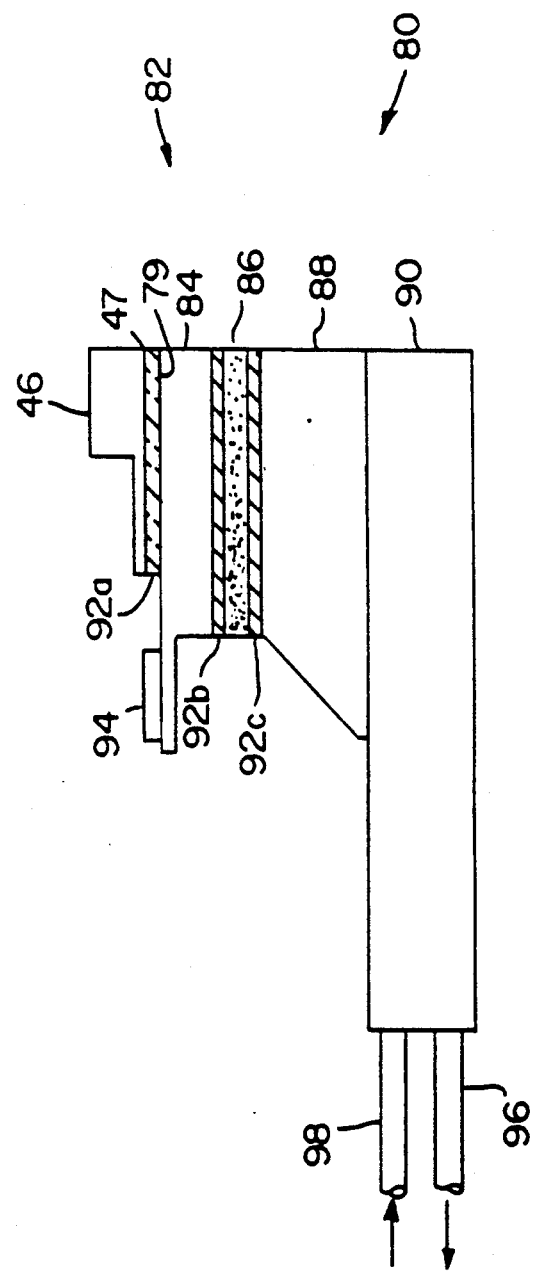
FIG. 10 is a schematic diagram of a thermal management system for a diode bar.

FIG. 10 is a schematic diagram of such a thermal management system for a diode bar. A surface 47 of the laser diode bar 46 is thermally connected to a surface 79 of a thermal control means 80 through an indium gasket 92$a$. The thermal control means 80 includes a thermal resistor 82 to a thermal spreader 88 and a heat exchanger 90. The thermal resistor 82 is connected to the thermal spreader 88 which, in turn, is thermally connected to the heat exchanger 90. The indium gasket 92$a$ between the laser diode bar 46 and the surface 79 of the thermal resistor 82 assures good thermal contact therebetween. The thermal resistor 88 is composed of a copper spacer 84 and a stainless steel spacer 86. The spacers 84 and 86 are spaced apart by indium gasket 92$b$. The thickness of the thermal resistor 82 is constant while the relative thickness of the copper spacer 84 and the stainless steel spacer 86 are varied to change the thermal resistance. Since the thermal conductivity of copper is roughly a factor of 20 larger than that of stainless steel, the temperature difference between the top and bottom of the thermal resistor 82 can be varied over a wide range by varying the relative thicknesses of the spacers 84 and 86.

The thermal spacer 86 is spaced apart from the thermal spreader 88 by an indium gasket 92c. The thermal spreader 88 is attached to a heat exchanger 90. Coolant is input to the heat exchanger 90 through the input port 96 and the heat is removed with the coolant through the output port 98. A small resistance heater 94 is attached to a tab on the copper spacer 84 for precise control of the operating temperature of the diode bar 45. The additional heat is used for fine adjustment of the wavelength of light produced by the diode 46. It has been determined that, when the diode operating temperatures are properly set, 96 percent of the incident pump light is absorbed in the solid-state gain medium 32.

As indicated above, detailed illustrative embodiments are disclosed herein. However, other systems, which may be detailed rather differently from the disclosed embodiments, are possible. For example, other disclosed embodiments can be employed with other solid-state gain media, pump sources with different physical parameters or geometries, specific lens designs, and different resonator designs. Consequently, the specific structural and functional details disclosed herein are merely representative: yet in that regard, they are deemed to afford the best embodiments for the purposes of disclosure and to provide a basis for the claims herein, which define the scope of the present invention.

I claim:

1. A laser amplifier, comprising:
   a solid-state gain medium located along an optical path, said gain medium having first and second opposite end surfaces that are intersected by said optical path; and
   at least one means for pumping said gain medium with a beam of pumping radiation to amplify optical energy directed through said gain medium, with each said pump beam offset from and circumferentially distributed about said optical path, and directed to substantially intersect said optical path after penetrating through one of said first and second opposite end surfaces of said solid-state gain medium.

2. The laser amplifier of claim 1 wherein each of said at least one means for pumping comprises at least one solid state light source.

3. The laser amplifier of claim 2 wherein each said at least one solid-state light source comprises a laser diode bar.

4. The laser amplifier of claim 1 wherein said at least one means for pumping comprises a first plurality of said means for pumping, with each of said means for pumping in said first plurality substantially equally offset from said optical path, substantially equally distant from one of said first and said second end surfaces of said gain medium, and each having its said pump beam directed to form substantially the same angle relative to said optical path.

5. The laser amplifier of claim 4 wherein said plurality of means for pumping are uniformly circumferentially distributed about said optical path.

6. The laser amplifier of claim 5 wherein said means for pumping further comprises a second plurality of means for pumping, with each of said means for pumping in said second plurality having a beam of pumping radiation offset from and circumferentially distributed about said optical path, and directed to substantially intersect said optical path after penetrating through the other one of said first and second opposite end surfaces of said solid-state gain medium, said second plurality of means for pumping being each substantially equally offset from said optical path, substantially equally distant from one of said first and said second end surfaces of said gain medium, and each having its said pump beam directed to form substantially the same angle relative to said optical path.

7. The laser amplifier of claim 1 wherein said at least one means for pumping comprises at least three of said means for pumping circumferentially distributed about said optical path.

8. The laser amplifier of claim 1 wherein said at least one means for pumping includes means for focussing said pump beam of said at least one means for pumping.

9. The laser amplifier of claim 1 wherein said first and second opposite surfaces of said gain medium are planar.

10. The laser amplifier of claim 9 wherein said first and second opposite end surfaces are oriented perpendicular to said optical path at the point of their intersection.

11. The laser oscillator of claim 1 wherein said at least one means for pumping includes means for focussing said pump beam of said at least one means for pumping.

12. A laser oscillator, comprising:
    a solid-state gain medium located along an optical path, said gain medium having first and second opposite end surfaces that are intersected by said optical path
    at least one means for pumping said gain medium with a beam of pumping radiation to produce optical energy, with each said pump beam offset from and circumferentially distributed about said optical path, and directed to substantially intersect said optical path after penetrating through one of said first and second opposite end surfaces of said solid-state gain medium; and
    an optical cavity, having a first optical element for reflecting said optical energy received along said optical path back along said optical path, and a second optical element for reflecting at least a portion of said optical energy reflected back along said optical path and transmitting the remainder of said energy out said optical cavity.

13. The laser oscillator of claim 12 wherein said at least one means for pumping comprises at least one solid-state light source.

14. The laser oscillator of claim 13 wherein each said at least one solid-state light source comprises a laser diode bar.

15. The laser oscillator of claim 12 wherein said at least one means for pumping comprises a first plurality of said means for pumping, with each of said means for pumping in said first plurality substantially equally offset from said optical path, substantially equally distant from one of said first and said second end surfaces of said gain medium, and each having its said pump beam directed to form substantially the same angle relative to said optical path.

16. The laser oscillator of claim 15 wherein said plurality of means for pumping are uniformly circumferentially distributed about said optical path.

17. The laser oscillator of claim 16 wherein said means for pumping further comprises a second plurality of means for pumping, with each of said means for pumping in said second plurality having a beam of pumping radiation offset from and circumferentially distributed about said optical path, and directed to substantially intersect said optical path after penetrating through the other one of said first and second opposite end surfaces of said solid-state gain medium, said second plurality of pump beam means being each substantially equally offset from said optical path, substantially equally distant from one of said first and said second end surfaces of said gain medium, and each having its said pump beam directed to form substantially the same angle relative to said optical path.

18. The laser oscillator of claim 12 wherein said at least one means for pumping comprises at least three of said means for pumping circumferentially distributed about said optical path.

19. The laser oscillator of claim 18 wherein each of said at least three means for pumping comprise at least one solid-state light source.

20. The laser oscillator of claim 19 wherein each of said at least three solid state sources comprises a laser diode bar.

21. The laser oscillator of claim 18 wherein said at least three means for pumping are substantially equally offset from said optical path, substantially equally distant from one of said first and said second end surfaces of said gain medium, and each having its said pump beam directed to form substantially the same angle relative to said optical path.

22. The laser oscillator of claim 21 wherein said at least three means for pumping are uniformly circumferentially distributed about said optical path.

23. The laser oscillator of claim 12 wherein said first and second opposite surfaces of said gain medium are planar.

24. The laser oscillator of claim 23 wherein said first and second opposite end surfaces are oriented perpendicular to said optical path at the point of their intersection.

25. A laser oscillator, comprising:
a solid-state gain medium located along an optical path, said gain medium having first and second opposite end surfaces that are intersected by said optical path
at least two means for pumping said gain medium, one of said means for pumping producing a plurality of beams of pumping radiation directed upon one opposite surface of said solid-state gain medium and the other of said means for pumping producing a plurality of beams of pumping radiation directed upon the other opposite surface of said solid-state gain medium, with said pump beams being directed through said opposite surfaces of said solid-state gain medium to substantially intersect said optical path; and
an optical cavity, having a first optical element for reflecting said optical energy received along said optical path back along said optical path, and a second optical element for reflecting at least a portion of said optical energy reflected back along said optical path and transmitting the remainder of said energy out said optical cavity.

26. The laser oscillator of claim 25 wherein each of said means for pumping comprises a solid-state source of laser radiation.

27. The laser oscillator of claim 26 wherein each said solid-state source comprises a plurality of laser diode bars.

28. The laser oscillator of claim 27 wherein said plurality of laser diode bars are uniformly spaced about said optical path.

29. The laser oscillator of claim 26 wherein each of said means for pumping further comprises means for producing a plurality of pump beams from a single beam of laser radiation.

30. The laser oscillator of claim 29 wherein each of said means for pumping further comprises focusing means for focusing each of said pump beams upon said first surface.

31. The laser oscillator of claim 25 wherein said first and second opposing surfaces are planar.

32. The laser oscillator of claim 25 wherein said respective first and second directions are perpendicular to said opposing surfaces.

33. The laser oscillator of claim 25 wherein said plurality of pump beams form the same angle on said first opposing surface of said solid state gain medium.

* * * * *